(12) United States Patent
Mizuno et al.

(10) Patent No.: US 7,501,611 B2
(45) Date of Patent: Mar. 10, 2009

(54) PHOTO DETECTOR APPARATUS

(75) Inventors: Seiichiro Mizuno, Hamamatsu (JP); Yasuhiro Suzuki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/596,072

(22) PCT Filed: May 2, 2005

(86) PCT No.: PCT/JP2005/008301

§ 371 (c)(1), (2), (4) Date: Jan. 2, 2008

(87) PCT Pub. No.: WO2005/108938

PCT Pub. Date: Nov. 17, 2005

(65) Prior Publication Data

US 2008/0197267 A1    Aug. 21, 2008

(30) Foreign Application Priority Data

May 10, 2004  (JP)  ............................ 2004-140073

(51) Int. Cl.
*H04N 3/14* (2006.01)
*H01J 40/14* (2006.01)

(52) U.S. Cl. ................................ 250/208.1; 250/214 R; 250/214 LS; 348/294

(58) Field of Classification Search .............. 250/208.1, 250/214 R, 214 LA, 214 LS, 214 C, 214 DC; 348/294, 297, 302–304; 327/514, 515
See application file for complete search history.

(56) References Cited

U.S. PATENT DOCUMENTS

2001/0008422 A1* 7/2001 Mizuno et al. .............. 348/302

FOREIGN PATENT DOCUMENTS

| JP | 2001-145030 | 5/2001 |
|---|---|---|
| JP | 2001-291877 | 10/2001 |
| JP | 2002-354195 | 12/2002 |
| JP | 2003-232679 | 8/2003 |
| WO | 00/45592 | 8/2000 |

OTHER PUBLICATIONS

S.L. Garverick, et al., "A 32-Channel Charge Readout IC for Programmable, Nonlinear Quantization of Multichannel Detector Data." IEEE Journal of Solid-State Circuits, vol. 30, No. 5, pp. 533-541 (1995).

* cited by examiner

*Primary Examiner*—Kevin Pyo
(74) *Attorney, Agent, or Firm*—Drinker Biddle & Reath LLP

(57) ABSTRACT

The present invention relates to a photodetector having a structure capable of increasing the dynamic range and of improving the S/N ratio for light detection. The photodetector includes a pixel including a photodiode, an integrating circuit, a CDS circuit, a selecting circuit, and a switching circuit. Charges generated by the photodiode are accumulated in an integral capacitor unit in the integrating circuit, and a first voltage value $V_1$ corresponding to the amount of accumulated charge is outputted from the integrating circuit. The CDS circuit receives the first voltage value and outputs a second voltage value $V_2$ corresponding to the variation of the first voltage value with reference to that at a reference time. The switching circuit compares the amount of charge generated by the photodiode with a threshold value therefor, and, based on the result of the comparison, instructs the integrating circuit to set the capacitance of the integral capacitor unit and instructs the selecting circuit to select one of the first and second voltages as an output voltage value.

3 Claims, 4 Drawing Sheets

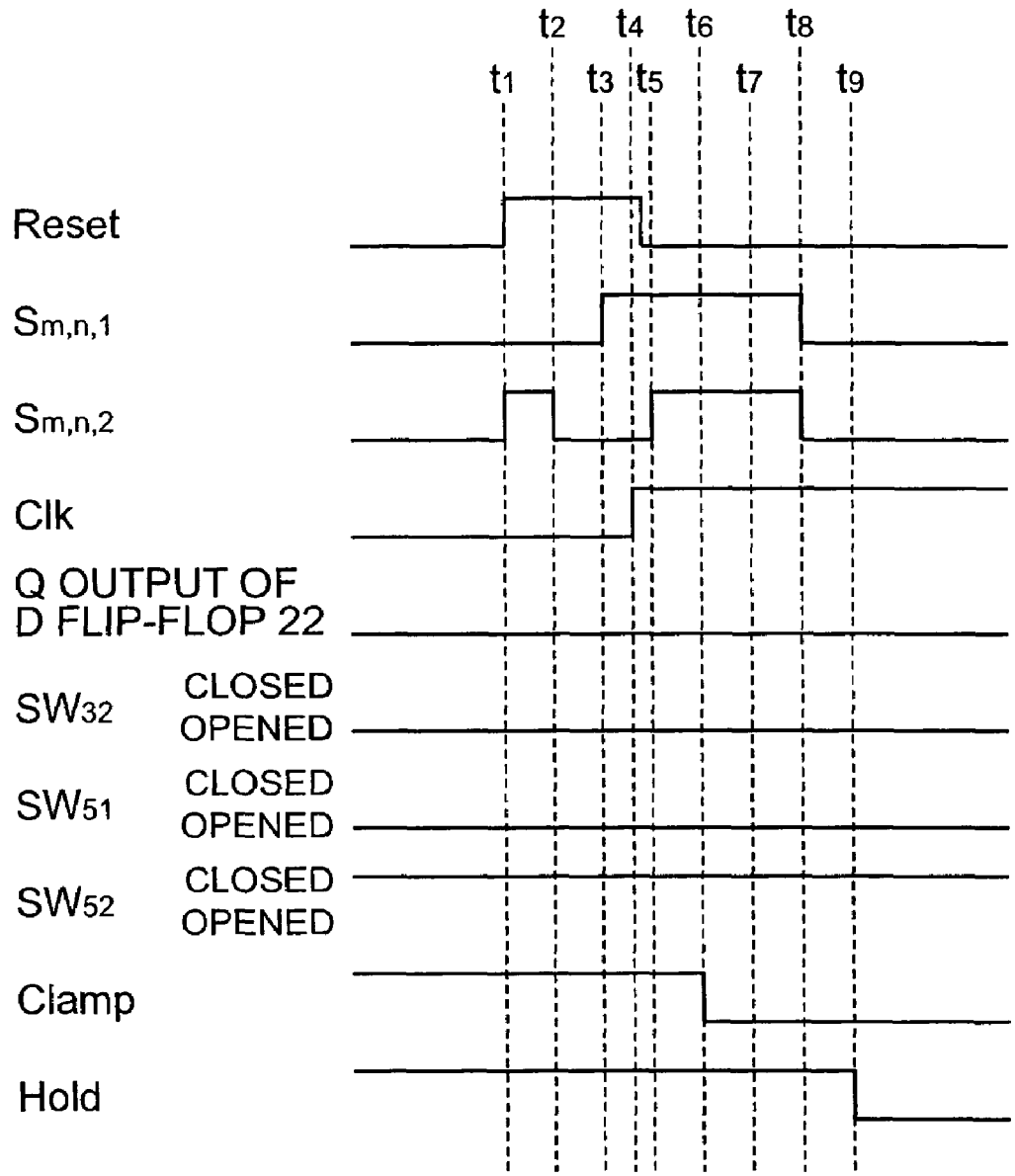

PHOTO DETECTOR APPARATUS

TECHNICAL FIELD

The present invention relates to a photodetector including one or more photodiodes.

BACKGROUND ART

A photodetector includes one or more photodiodes and integrating circuits each outputting a voltage value corresponding to the amount of charge outputted from the associated photodiode. In such a photodetector, charges generated by the photodiodes in response to light incidence are accumulated in integral capacitor units of the integrating circuits, and then voltage values corresponding to the amount of accumulated charge are output from the integrating circuits. The intensity of incident light to the photodiodes can be obtained based on the voltage values outputted from the integrating circuits. It is noted that photodetectors with a plurality of photodiodes arranged one- or two-dimensionally therein are utilized as solid-state imaging devices.

A photodetector having such a structure as described above can be produced by CMOS technology, where the dynamic range for detecting incident light intensity can be increased by changing the capacitance of integral capacitor units for converting the amount of input charge into output voltage values in the integrating circuits. For example, in the photodetector described in Non-Patent Document 1, each integrating circuit has an integral capacitor unit with the variable capacitance provided between the input and output terminals of an amplifier, where charges outputted from photodiodes are accumulated in the integral capacitor units and voltage values corresponding to the amount of accumulated charge are output. Then, in the photodetector described in Non-Patent Document 1, external control is provided to set the capacitance of the integral capacitor units appropriately and thereby to increase the dynamic range for detecting incident light intensity.

That is, even in the case of a low incident light intensity, reducing the capacitance of the integral capacitor units allows detection sensitivity to be improved, while even in the case of a high incident light intensity, increasing the capacitance of the integral capacitor units allows saturation of output signals to be avoided. Even in the case of imaging a very bright subject during a midsummer day for example, applying such a photodetector (solid-state imaging device) allows the subject to be imaged with no saturation of output signals. Also, even in the case of imaging a very dark subject at night for example, the subject can be imaged at a high sensitivity.

Further, there may be provided CDS (Correlated Double Sampling) circuits at the subsequent stage of the respective integrating circuits. The CDS circuits output voltage values corresponding to the difference between voltage values to be outputted from the integrating circuits, respectively, at the beginning and end of charge accumulation operations in the integrating circuits. Providing the CDS circuits allows reset switching noise in the integrating circuits to be eliminated and thereby light detection at a high S/N ratio to be achieved.

Non-Patent Document 1: S. L. Garverick, et al., "A 32-Channel Charge Readout IC for Programmable, Nonlinear Quantization of Multichannel Detector Data," IEEE Journal of Solid-State Circuits, Vol. 30, No. 5, pp. 533-541 (1995)

DISCLOSURE OF THE INVENTION

Problem to be Solved by the Invention

The inventors have studied conventional photodetectors in detail, and as a result, have found problems as follows. That is, even when CDS circuits may be provided in the conventional photodetector, the S/N ratio for light detection may not be improved depending on the capacitance of the integral capacitor units in the integrating circuits.

In order to overcome the above-mentioned problems, it is an object of the present invention to provide a photodetector having a structure capable of increasing the dynamic range and of improving the S/N ratio for light detection.

Means for Solving Problem

A photodetector according to the present invention comprises a photodiode, an integrating circuit, a CDS circuit, a selecting circuit, and a switching circuit. The photodiode generates charges in response to the intensity of incident light. The integrating circuit has an integral capacitor unit whose capacitance is variable. Then, the integrating circuit accumulates charges generated by the photodiode in the integral capacitor unit and outputs a first voltage value corresponding to the amount of charge accumulated in the integral capacitor unit. The CDS circuit receives the first voltage value outputted from the integrating circuit and outputs a second voltage value corresponding to the variation of the first voltage value with reference to that at a reference time. The selecting circuit receives the first voltage value outputted from the integrating circuit together with the second voltage value outputted from the CDS circuit, selects one of these values, and outputs the selected voltage value as an output voltage value. The switching circuit compares the amount of charge generated by the photodiode with a threshold value therefor, and then instructs the integrating circuit to set the capacitance of the integral capacitor unit and instructs the selecting circuit to select the output voltage value, based on the result of the comparison.

In particular, when the amount of charge generated by the photodiode is the threshold value or more, the switching circuit instructs the integrating circuit to set the integral capacitor unit to a first capacitance and instructs the selecting circuit to output the first voltage value as the selected output voltage value. On the other hand, when the amount of charge generated by the photodiode is smaller than the threshold value, the switching circuit instructs the integrating circuit to set the integral capacitor unit to a second capacitance smaller than the first capacitance and instructs the selecting circuit to output the second voltage value as the selected output voltage value.

In the photodetector according to the present invention, the photodiode generates charges in response to the intensity of incident light. The charges are accumulated by the variable capacitance in the integral capacitor unit of the integrating circuit, and a first voltage value corresponding to the amount of accumulated charge is outputted from the integrating circuit. The first voltage value outputted from the integrating circuit is inputted into the CDS circuit, and a second voltage value corresponding to the variation of the first voltage value with reference to that at a reference time is outputted from the CDS circuit. Also, the amount of charge generated by the photodiode is compared with a threshold value therefor by the switching circuit and then, based on the result of the comparison, the capacitance of the integral capacitor unit in the integrating circuit is set, and an output voltage value in the selecting circuit is selected. That is, when the amount of charge generated by the photodiode is the threshold value or more, the integral capacitor unit in the integrating circuit is set to a first capacitance and the first voltage value is outputted from the selecting circuit as the selected output voltage value. On the other hand, when the amount of charge generated by the photodiode is smaller than the threshold value, the integral capacitor unit in the integrating circuit is set to a second capacitance smaller than the first capacitance and the second voltage value is outputted from the selecting circuit as the selected output voltage value.

The photodetector according to the present invention may further comprises an A/D converting circuit which receives the voltage value outputted from the selecting circuit converts the voltage value into a digital value, and outputs the converted digital value. The photodetector according to the present invention may further comprises a bit-shifting circuit which receives the digital value outputted from the A/D converting circuit, bit-shifts the digital value depending on the condition that the integral capacitor unit in the integrating circuit is set to one of the first capacitance and second capacitance, and outputs the bit-shifted digital value.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

Effect of the Invention

In accordance with the photodetector according to the present invention, it is possible to increase the dynamic range for light detection and to achieve light detection at an improved S/N ratio.

BRIEF DESCRIPTION OF THE DRAWINGS

FIG. 4 shows a timing chart for explaining the operation of the photodetector shown in FIG. 1 (Part 2).

DESCRIPTION OF THE REFERENCE NUMERALS

1 . . . photodetector; 10 . . . photodetecting section; 20 . . . switching circuit; 30 . . . integrating circuit; 40 . . . CDS circuit; 50 . . . selecting circuit; 60 . . . holding circuit; 70 . . . A/D converting circuit; and 80 . . . bit-shifting circuit.

BEST MODE FOR CARRYING OUT THE INVENTION

In the following, embodiments of a photodetector according to the present invention will be explained in detail with reference to FIGS. 1 to 4. In the explanation of the drawings, constituents identical to each other will be referred to with numerals identical to each other without repeating their overlapping descriptions.

First, explained is how the present inventors reached the present invention. Noise components $V_n$ included in the output voltage value of an integrating circuit can be represented approximately by the following Formula (1), where $C_d$ represents the junction capacitance of a photodiode; $C_f$ represents the capacitance of an integral capacitor unit in the integrating circuit; "k" represents the Boltzmann constant; T represents the absolute temperature; B represents the frequency range of the entire readout circuit centered on the integrating circuit; and $G_m$ represents the conductance of a first-stage transistor constituting the integrating circuit.

[Formula 1]

$$V_n \approx \sqrt{\left(\frac{C_d}{C_f}\sqrt{\frac{8kTB}{3G_m}}\right)^2 + \frac{kT}{C_f}} \quad (1)$$

The first term in the square root at the right side of Formula (1) represents noise components due to thermal noise of an amplifier included in the integrating circuit, and the second term represents reset switching noise components. The CDS circuit is for eliminating the reset switching noise components at the right side of Formula (1). Noise components $V_n$ included in the output voltage value of the CDS circuit can be represented approximately by the following Formula (2), where $V_\alpha$ represents noise components mainly caused by an amplifier included in the CDS circuit.

[Formula 2]

$$V_n \approx \sqrt{\left(\frac{C_d}{C_f}\sqrt{\frac{8kTB}{3G_m}}\right)^2 + V_\alpha^2} \quad (2)$$

So far, it has generally been considered that $V_\alpha$ has a sufficiently small value and providing a CDS circuit allows for noise reduction and thereby S/N ratio improvement. However, $V_\alpha$ does not actually have a sufficiently small value and when the capacitance $C_f$ of the integral capacitor unit in the integrating circuit is large, the value of $V_\alpha$ has a significant impact to cause the value of Formula (2) to be greater than that of Formula (1), whereby providing a CDS circuit rather results in an increase in noise. The present invention has been made based on the above-described findings of the present inventors.

Figure 1:
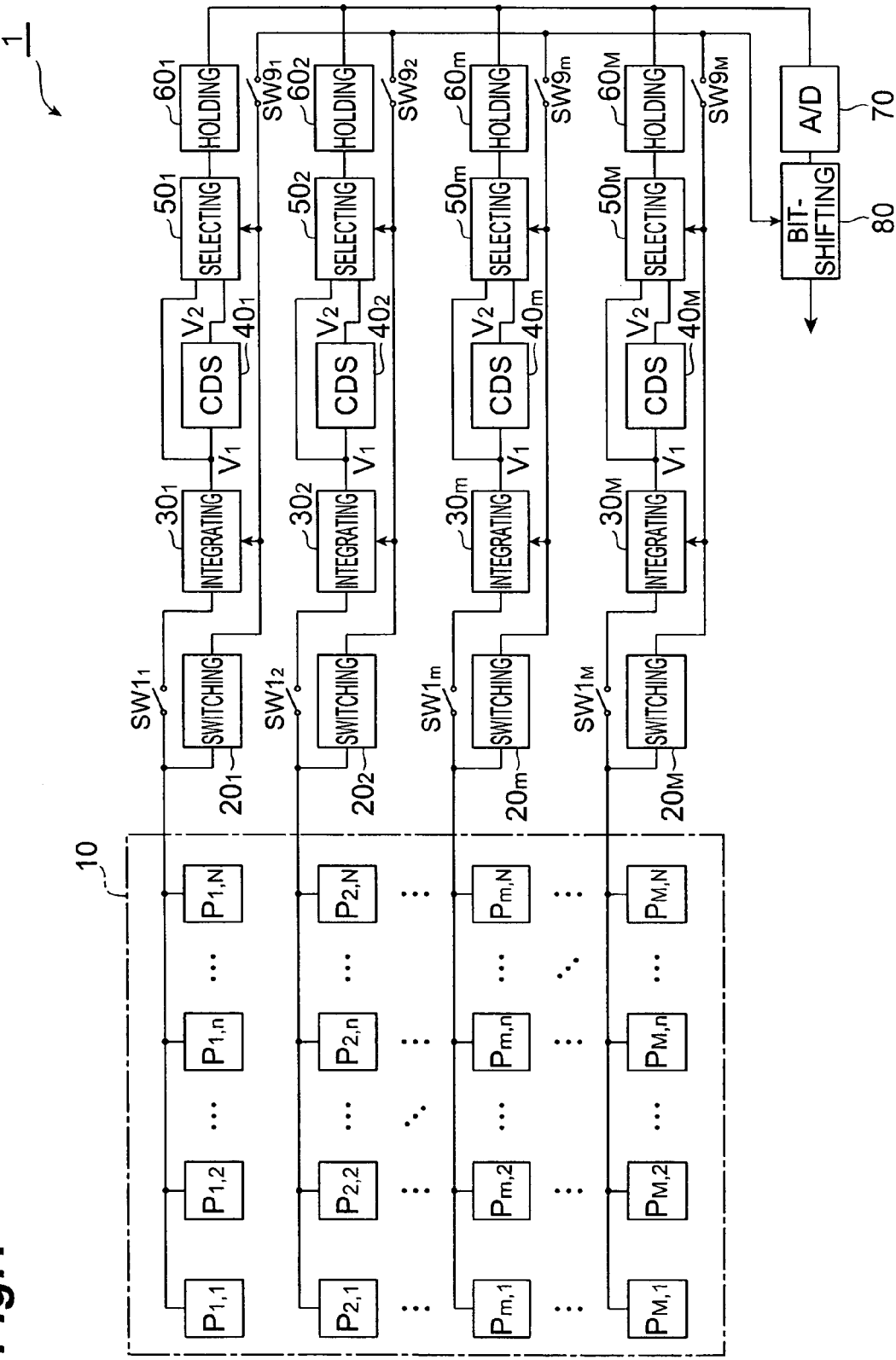
FIG. 1 is a view showing the overall configuration of a photodetector according to an embodiment of the present invention.

Next, a photodetector according to an embodiment of the present invention will be explained. FIG. 1 is a view showing the overall configuration of the photodetector according to the embodiment of the present invention. The photodetector 1 shown in FIG. 1 comprises a photodetecting section 10 including M×N pixels $P_{1,1}$ to $P_{M,N}$, M switches $SW1_1$ to $SW1_M$, switching circuits $20_1$ to $20_M$, integrating circuits $30_1$ to $30_M$, CDS circuits $40_1$ to $40_M$, selecting circuits $50_1$ to $50_M$, holding circuits $60_1$ to $60_M$, an A/D converting circuit 70, a bit-shifting circuit 80, and M switches $SW9_1$ to $SW9_M$. Here, M and N each represent an integer of 2 or more.

Each of the M×N pixels $P_{1,1}$ to $P_{M,N}$ has a common composition. Each of the M switching circuits $20_1$ to $20_M$ also has a common composition. Each of the M integrating circuits $30_1$ to $30_M$ also has a common composition. Each of the M CDS circuits $40_1$ to $40_M$ also has a common composition. Each of the M selecting circuits $50_1$ to $50_M$ also has a common composition. Then, each of the M holding circuits $60_1$ to $60_M$ also has a common composition.

In the photodetecting section 10, the pixel $P_{m,n}$ is positioned at the m-th row and the n-th column. The switch $SW1_m$, switching circuit $20_m$, integrating circuit $30_m$, CDS circuit $40_m$, selecting circuit $50_m$, holding circuit $60_m$, and switch $SW9_m$ are provided correspondingly to the N pixels $P_{m,1}$ to $P_{m,N}$ that constitute the m-th row of the photodetecting section 10. Also, the A/D converting circuit 70 and bit-shifting circuit 80 are each provided with only one for the entire photodetector 1. Here, "m" represents any integer of 1 or more but M or less, and "n" represents any integer of 1 or more but N or less.

Each pixel $P_{m,n}$ includes a photodiode which generates charges in response to the intensity of incident light. The N pixels $P_{m,1}$ to $P_{m,N}$ that constitute the m-th row are connected to the switching circuit $20_m$ via a common wiring and further to the integrating circuit $30_m$ via the common wiring and the switch $SW1_m$.

The integrating circuit $30_m$ has an integral capacitor unit with a variable capacitance and accumulates charges generated by the photodiodes included in the respective N pixels $P_{m,1}$ to $P_{m,N}$ that constitute the m-th row in the integral capacitor unit and outputs a first voltage value $V_1$ corresponding to the amount of charge accumulated in the integral capacitor unit. The CDS circuit $40_m$ receives the first voltage value $V_1$ output from the integrating circuit $30_m$ and outputs a second voltage value $V_2$ corresponding to the variation of the first voltage value $V_1$ with reference to that at a reference time.

The selecting circuit $50_m$ receives the first voltage value $V_1$ being outputted from the integrating circuit $30_m$ and the second voltage value $V_2$ outputted from the CDS circuit $40_m$, selects one of these values, and outputs the selected voltage value as an output voltage value. The switching circuit $20_m$ compares the amount of charge generated by the photodiodes included in the respective N pixels $P_{m,1}$ to $P_{m,N}$ that constitute the m-th row with a threshold value therefor, and instructs the integrating circuit $30_m$ to set the capacitance of the integral capacitor unit and instructs the selecting circuit $50_m$ to select the output voltage value, based on the result of the comparison.

The A/D converting circuit 70 receives voltage values outputted sequentially from the M selecting circuits $50_1$ to $50_M$ after once holding in each holding circuit $60_m$, converts the voltage values into digital values, and outputs the converted digital values. The bit-shifting circuit 80 receives the digital values outputted from the A/D converting circuit 70, bit-shifts the digital values depending on the capacitance of the integral capacitor unit in each integrating circuit $30_m$, and outputs the bit-shifted digital values.

Figure 2:
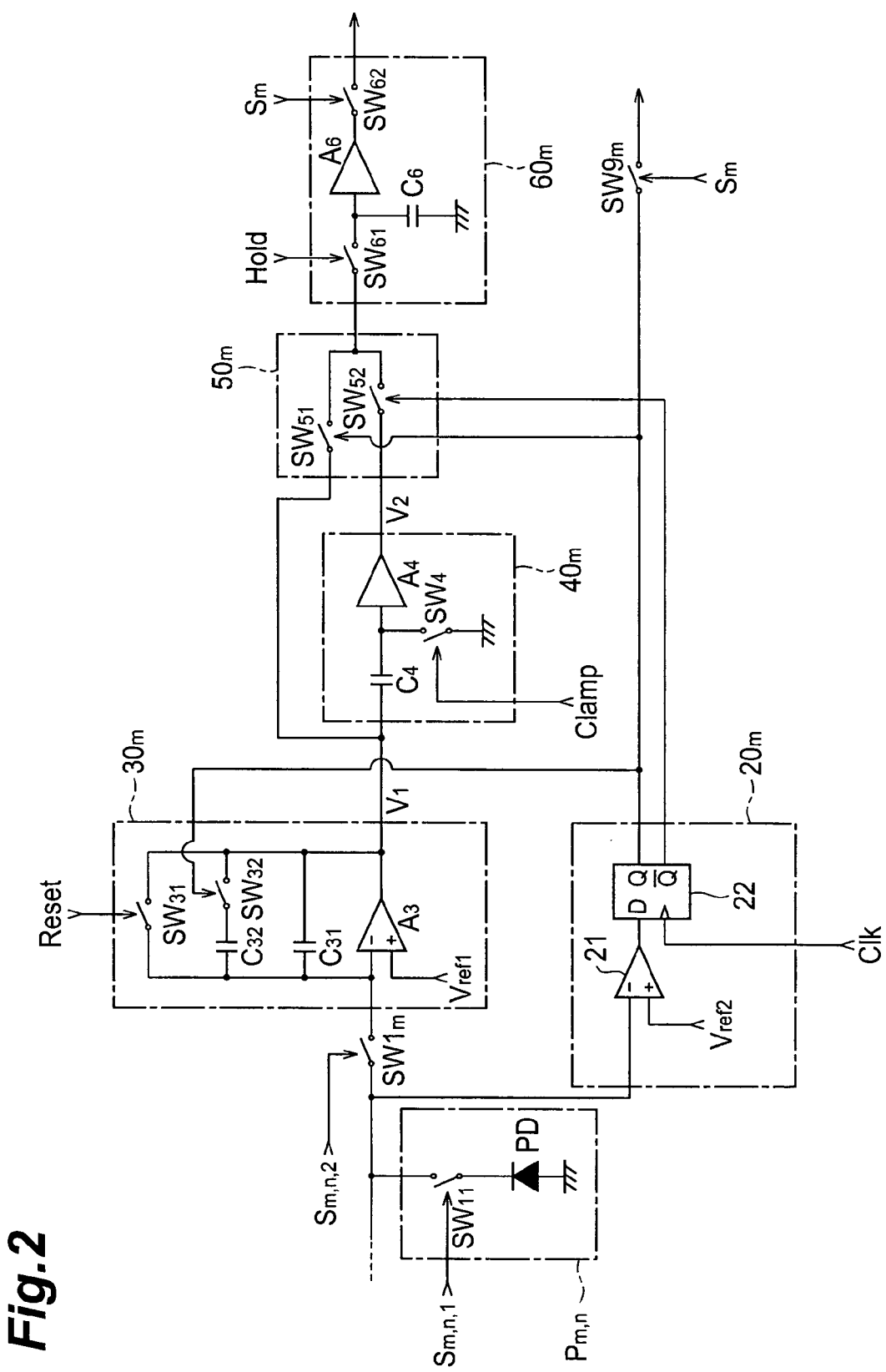
FIG. 2 is a circuit diagram including a pixel $P_{m,n}$, a switching circuit $20_m$, an integrating circuit $30_m$, a CDS circuit $40_m$, a selecting circuit $50_m$, and a holding circuit $60_m$ in the photodetector shown in FIG. 1.

FIG. 2 is a circuit diagram including a pixel $P_{m,n}$, switching circuit $20_m$, integrating circuit $30_m$, CDS circuit $40_m$, selecting circuit $50_m$, and holding circuit $60_m$ in the photodetector 1 shown in FIG. 1.

The pixel $P_{m,n}$ includes a photodiode PD and a switch $SW_{11}$. The anode terminal of the photodiode PD is grounded. The cathode terminal of the photodiode PD is connected to a common wiring via the switch $SW_{11}$, and the common wiring is connected to the input terminal of the switching circuit $20_m$ and further to the input terminal of the integrating circuit $30_m$ via the switch $SW1_m$. The switch $SW_{11}$ opens and closes based on the level of a control signal $S_{m,n,1}$. Also, the switch $SW1_m$ opens and closes based on the level of a control signal $S_{m,n,2}$.

When the Reset signal and the control signal $S_{m,n,2}$ are at a high level, the switch $SW1_m$ is closed, so that the charge on the common wiring connected to the non-inverting input terminal of the comparator 21 is initialized.

The switching circuit $20_m$ includes the comparator 21 and a D flip-flop 22. The non-inverting input terminal of the comparator 21 is connected with a reference potential $V_{ref2}$. The inverting input terminal of the comparator 21 is connected with the common wiring that is connected to the switches $SW_{11}$ in the respective N pixels $P_{m,1}$ to $P_{m,N}$ that constitute the m-th row. The D flip-flop 22 outputs a logic level that is input to the D input terminal at the time when the Clk signal shifts from a low level to a high level from the Q output terminal after the time, and outputs the logic level opposite that at the Q output terminal from the inverted Q output terminal.

In the switching circuit $20_m$, the comparator 21 compares the input voltage values at the inverting and non-inverting input terminals. A logic level representing the result of the comparison is outputted from the output terminal of the comparator 21 and then inputted to the D input terminal of the D flip-flop 22. The output level of the comparator 21, at the time when the Clk signal shifts from a low level to a high level, is outputted from the Q output terminal of the D flip-flop 22 after the time.

The integrating circuit $30_m$ includes an amplifier $A_3$, capacitive elements $C_{31}$ and $C_{32}$, and switches $SW_{31}$ and $SW_{32}$. The non-inverting input terminal of the amplifier $A_3$ is connected with a reference potential $V_{ref1}$. The inverting input terminal of the amplifier $A_3$ is connected with the common wiring, which is connected to the switches $SW_{11}$ in the respective N pixels $P_{m,1}$ to $P_{m,N}$ that constitute the m-th row, via the switch $SW1_m$. Between the inverting input terminal and output terminal of the amplifier $A_3$, the capacitive element $C_{31}$, switch $SW_{31}$, and capacitive element $C_{32}$ and switch $SW_{32}$ connected in series with each other are provided parallel with each other. The switch $SW_{31}$ opens and closes based on the level of the Reset signal. The switch $SW_{32}$ opens and closes based on the logic level to be output from the Q output terminal of the D flip-flop 22 in the switching circuit $20_m$.

In the integrating circuit $30_m$, the capacitive elements $C_{31}$ and $C_{32}$ and switch $SW_{32}$ constitute a integral capacitor unit whose capacitance is variable. That is, when the switch $SW_{32}$ is closed, the integral capacitor unit is set to a first capacitance $C_1 (=C_{31}+C_{32})$, while when the switch $SW_{32}$ is opened, the integral capacitor unit is set to a second capacitance $C_2 (=C_{31})$. When the Reset signal is at a high level, the switch $SW_{31}$ is closed to discharge the capacitive element $C_{31}$, so that the output voltage value of the integrating circuit $30_m$ is initialized. When the switch $SW_{32}$ is closed simultaneously, the capacitive element $C_{32}$ is also discharged. When the Reset signal is at a low level, charges outputted from the pixel $P_{m,n}$ are accumulated in the integral capacitor unit, and a first voltage value $V_1$ corresponding to the amount of accumulated charge is outputted from the integrating circuit $30_m$.

The CDS circuit $40_m$ includes an amplifier $A_4$, a capacitive element $C_4$, and a switch $SW_4$. The input terminal of the amplifier $A_4$ is connected to the output terminal of the amplifier $A_3$ in the integrating circuit $30_m$ via the capacitive element $C_4$ and is grounded via the switch $SW_4$. The switch $SW_4$ opens and closes based on the level of the Clamp signal. In the CDS circuit $40_m$, when the switch $SW_4$ is closed, the output voltage value of the amplifier $A_4$ is initialized. Also, when the switch $SW_4$ is opened, a second voltage value $V_2$ according to the change of the first voltage value $V_1$ to be outputted from the integrating circuit $30_m$ after the opening of the switch $SW_4$ is outputted.

The selecting circuit $50_m$ includes switches $SW_{51}$ and $SW_{52}$. The first terminal of the switch $SW_{51}$ is connected to the output terminal of the amplifier $A_3$ in the integrating circuit $30_m$. The first terminal of the switch $SW_{52}$ is connected to the output terminal of the amplifier $A_4$ in the CDS circuit $40_m$. The second terminals of the switches $SW_{51}$ and $SW_{52}$ are connected to each other. The switch $SW_{51}$ opens and closes based on the logic level to be outputted from the Q output terminal of the D flip-flop 22 in the switching circuit $20_m$. Also, the switch $SW_{52}$ opens and closes based on the logic level to be outputted from the inverted Q output terminal of the D flip-flop 22 in the switching circuit $20_m$. In the selecting circuit $50_m$, when one of the switch $SW_{51}$ and $SW_{52}$ is closed, one of the first voltage value $V_1$ outputted from the integrating circuit $30_m$ and the second voltage value $V_2$ outputted from the CDS circuit $40_m$ is selected, and then the selected voltage value is outputted as an output voltage value.

The holding circuit $60_m$ includes a capacitive element $C_6$, a switch $SW_{61}$, a buffer circuit $A_6$, and a switch $SW_{62}$. One terminal of the capacitive element $C_6$ is grounded. The other terminal of the capacitive element $C_6$ is connected to the output terminal of the selecting circuit $50_m$ via the switch $SW_{61}$ and is connected to the input terminal of the A/D converting circuit 70 via the buffer circuit $A_6$ and switch $SW_{62}$. The switch $SW_{61}$ opens and closes based on the level of the Hold signal. The switch $SW_{62}$ opens and closes based on the level of a control signal $S_m$. In the holding circuit $60_m$, when the switch $SW_{61}$ is opened, the output voltage value of the selecting circuit $50_m$ immediately before the opening of the switch $SW_{61}$ is held by the capacitive element $C_6$. Also, when the switch $SW_{62}$ is closed, the voltage value held by the capacitive element $C_6$ is outputted.

In addition, the switch $SW9_m$ connected to the Q output terminal of the D flip-flop 22 in the switching circuit $20_m$ opens and closes based on the level of the control signal $S_m$ at the same timing as the switch $SW_{62}$ in the holding circuit $60_m$.

Figure 3:
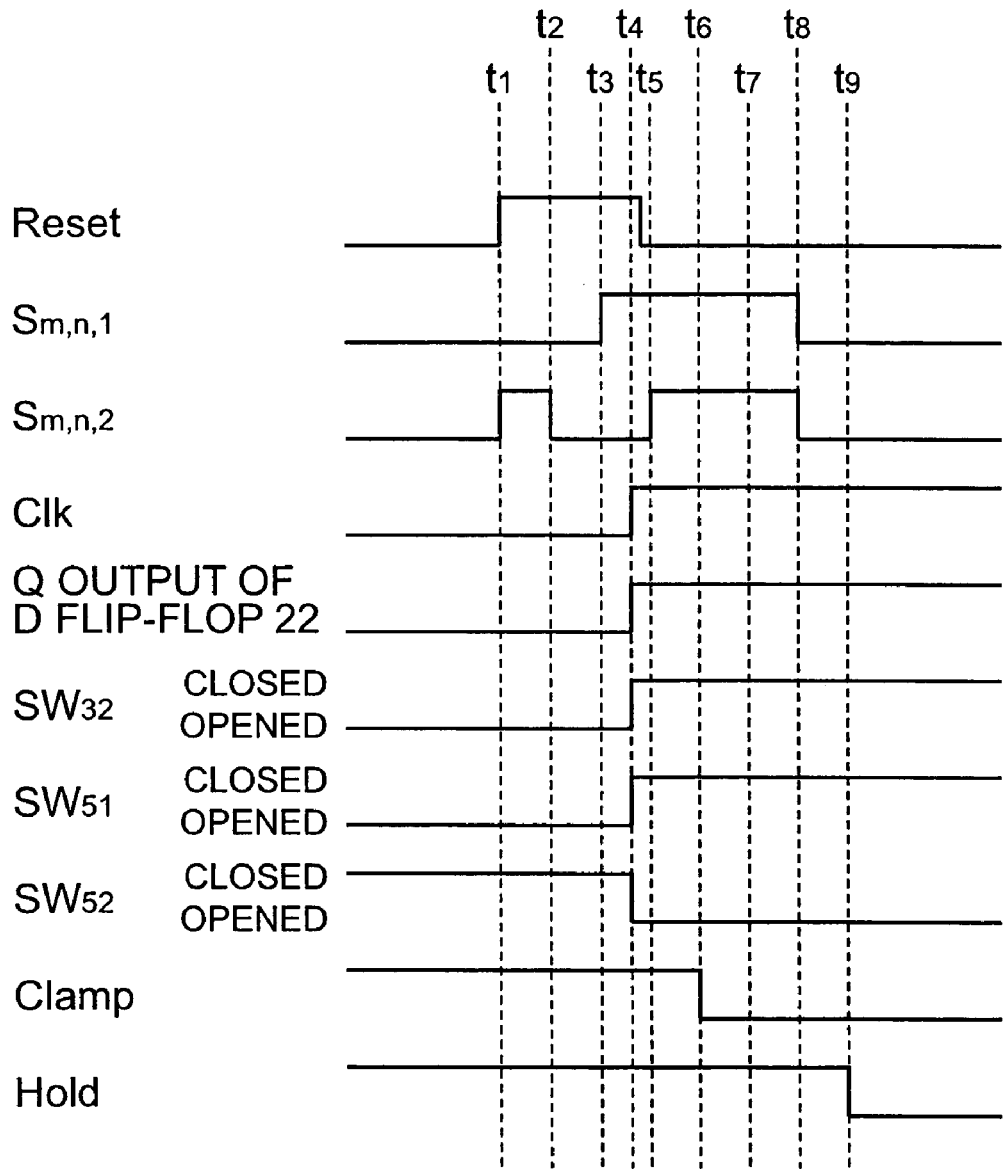
FIG. 3 shows a timing chart for explaining the operation of the photodetector shown in FIG. 1 (Part 1)

Next, the operation of the photodetector 1 having such a structure as described above will be explained. The more the amount of applied light increases, the lower the cathode potential of photodiodes decreases due to generated carriers. That is, in the case of light having a high intensity, the cathode potential of photodiodes is lower than the reference potential $V_{ref2}$, while in the case of light having a low intensity, the cathode potential of photodiodes is higher than the reference potential $V_{ref2}$. FIGS. 3 and 4 are timing charts each for explaining the operation of the photodetector 1 shown in FIG. 1. FIG. 3 shows the operation in the case where incident light to the photodiode PD has a relatively high intensity, while FIG. 4 shows the operation in the case where incident light to the photodiode PD has a relatively low intensity. In addition, the photodetector 1 operates as follows based on various control signals to be outputted from a control section (not shown).

FIGS. 3 and 4 show the level of the Reset signal for controlling the opening and closing operation of the switch $SW_{31}$ in the integrating circuit $30_m$, the level of the control signal $S_{m,n,1}$ for controlling the opening and closing operation of the switch $SW_{11}$ in the pixel $P_{m,n}$, the level of the control signal $S_{m,n,2}$ for controlling the opening and closing operation of the switch $SW1_m$, the level of the Clk signal input to the D flip-flop 22 in the switching circuit $20_m$, the level of the logic signal output from the Q output terminal of the D flip-flop 22 in the switching circuit $20_{m,n}$ the opening and closing of the switch $SW_{32}$ in the integrating circuit $30_m$, the opening and closing of the switch $SW_{51}$ in the selecting circuit $50_m$, the opening and closing of the switch $SW_{52}$ in the selecting circuit $50_m$, the level of the Clamp signal for controlling the opening and closing operation of the switch $SW_4$ in the CDS circuit $40_m$, and the level of the Hold signal for controlling the opening and closing operation of the switch $SW_{61}$ in the holding circuit $60_m$ in this order from the top.

The Reset signal is made high at time $t_1$. This causes the switch $SW_{31}$ in the integrating circuit $30_m$ to be closed, so that the output voltage value $V_1$ of the integrating circuit $30_m$ is initialized. The control signal $S_{m,n,2}$ is also made high to close the switch $SW1_m$, so that the charge on the wiring connected to the non-inverting input terminal of the comparator 21 is initialized. The control signal $S_{m,n,2}$ is made low at time $t_2$ to open the switch $SW1_m$, so that the common wiring and the integrating circuit $30_m$ are disconnected.

During the following time period from $t_3$ to $t_8$, the control signal $S_{m,n,1}$ is made high to close the switch $S_{W11}$ in the pixel $P_{m,n}$. This causes the comparator 21 in the switching circuit $20_m$ to compare the cathode potential of the photodiode PD in the pixel $P_{m,n}$ with the reference potential $V_{ref2}$. Then, when the Clk signal is made high at time $t_4$ during the time period from $t_3$ to $t_5$, the output logic level of the comparator 21 at the time $t_4$ is held by the D flip-flop 22 and is outputted from the Q output terminal of the D flip-flop 22 after the time $t_4$. The Reset signal is made low partially during the time period from $t_4$ to $t_5$.

In the case above, when the cathode potential of the photodiode PD in the pixel $P_{m,n}$ is the reference potential $V_{ref2}$ or less, that is, when the amount of charge generated by the photodiode PD in the pixel $P_{m,n}$ is a certain threshold value or more, the logic level to be outputted from the Q output terminal of the D flip-flop 22 is made high after the time $t_4$, as shown in FIG. 3, and thereby the switch $SW_{32}$ in the integrating circuit $30_m$ is closed, so that the integral capacitor unit in the integrating circuit $30_m$ is set to a first capacitance $C_1(=C_{31}+C_{32})$. Since the Reset signal is at a high level partially during the time period from $t_4$ to $t_5$, the switch $SW_{31}$ in the integrating circuit $30_m$ is closed and the charge of the capacitive element $C_{32}$ is initialized. Also, the switch $SW_{51}$ is closed while the switch $SW_{52}$ is opened in the selecting circuit $50_m$, so that the output voltage value V1 of the integrating circuit $30_m$ is to be outputted from the selecting circuit $50_m$.

On the other hand, when the cathode potential of the photodiode PD in the pixel $P_{m,n}$ is the reference potential $V_{ref2}$, or more, that is, when the amount of charge generated by the photodiode PD in the pixel $P_{m,n}$ is the threshold value or less, the logic level to be outputted from the Q output terminal of the D flip-flop 22 is made low after the time $t_4$, as shown in FIG. 4, and thereby the switch $SW_{32}$ in the integrating circuit $30_m$ is opened, so that the integral capacitor unit in the integrating circuit $30_m$ is set to a second capacitance $C_2$ ($=C_{31}$). Also, the switch $SW_{51}$ is opened while the switch $SW_{52}$ is closed in the selecting circuit $50_m$, so that the output voltage value $V_2$ of the CDS circuit $40_m$ is to be outputted from the selecting circuit $50_m$.

During the time period from $t_5$ to $t_8$, the control signal $S_{m,n,2}$ is made high to close the switch $SW1_m$ in the common wiring. This causes charges generated by the photodiode PD in the pixel $P_{m,n}$ and stored in the junction capacitance thereof to be transferred to and accumulated in the integral capacitor unit in the integrating circuit $30_m$, and a first voltage value $V_1$ corresponding to the amount of accumulated charge is outputted from the integrating circuit $30_m$. The first voltage value $V_1$ outputted from the integrating circuit $30_m$ is inputted to the CDS circuit $40_m$, and then a second voltage value $V_2$ corresponding to the variation of the first voltage value $V_1$ is outputted from the CDS circuit $40_m$.

The Clamp signal is made low at time $t_6$ following the time $t_5$ to open the switch $SW_4$ in the CDS circuit $40_m$. This causes the second voltage value $V_2$ corresponding to the variation of the first voltage value $V_1$ with reference to that at the time $t_6$ to be outputted from the CDS circuit $40_m$ thereafter.

The Hold signal is made low at time $t_9$ following the time $t_8$ to open the switch $SW_{61}$ in the holding circuit $60_m$. This causes the voltage value output from the selecting circuit $50_m$ before the time $t_9$ to be held by the capacitive element $C_6$ in the holding circuit $60_m$.

As described above, when the intensity of incident light to the pixel $P_{m,n}$ is high and the amount of charge generated by the photodiode PD is the threshold value or more (FIG. 3), the integral capacitor unit in the integrating circuit $30_m$ is set to the first capacitance $C_1(=C_{31}+C_{32})$ and the voltage value outputted from the selecting circuit $50_m$ and held by the holding circuit $60_m$ at the time $t_9$ is the first voltage value $V_1$ outputted from the integrating circuit $30_m$. On the other hand, when the intensity of incident light to the pixel $P_{m,n}$ is low and the amount of charge generated by the photodiode PD is smaller than the threshold value (FIG. 4), the integral capacitor unit in the integrating circuit $30_m$ is set to the second capacitance $C_2(=C_{31})$ that is smaller than the first capacitance $C_1$ and the voltage value outputted from the selecting circuit $50_m$ and held by the holding circuit $60_m$ at the time $t_9$ is the second voltage value $V_2$ outputted from the CDS circuit $40_m$.

That is, when the amount of charge generated by the photodiode PD in the pixel $P_{m,n}$ is the threshold value or more, the capacitance of the integral capacitor unit in the integrating circuit $30_m$ is set greater, whereby the dynamic range for incident light intensity detection can be increased. Also, when the capacitance of the integral capacitor unit in the integrating circuit $30_m$ is set greater, the value of $V_\alpha$ in Formula (2) will give a significant impact, where not the second voltage value $V_2$ outputted from the CDS circuit $40_m$ but the first voltage value $V_1$ outputted from the integrating circuit $30_m$ is to be selected by the selecting circuit $50_m$ and held by the holding circuit $60_m$, which allows the S/N ratio for light detection to be improved.

The above-described operation is to be performed parallel for the first to m-th rows, and to be performed sequentially for the N pixels $P_{m,1}$ to $P_{m,N}$ in each row. When the operation is completed for the n-th pixel $P_{m,n}$ in each row, the control signal $S_m$ to be input to the switch $SW_{62}$ in each holding circuit $60_m$ and to each switch $SW9_m$ is made high sequentially. This causes the voltage value held by the holding circuit $60_m$ to be inputted to the A/D converting circuit 70 and then converted into a digital value. Further, the digital value output from the A/D converting circuit 70 is to be shifted by the required number of bits by the bit-shifting circuit 80 based on the logic level to be outputted from the Q output terminal of the D flip-flop 22 in the switching circuit $20_m$.

That is, assuming that the ratio between the first and second capacitances $C_1$ and $C_2$ ($C_1/C_2$) of the integral capacitor unit in the integrating circuit $30_m$ is $2^P$, when the logic level to be outputted from the Q output terminal of the D flip-flop 22 in the switching circuit $20_m$ is at a high level (i.e. the integral capacitor unit in the integrating circuit $30_m$ is set to the first capacitance $C_1$), the digital value outputted from the A/D converting circuit 70 is to be shifted higher by "p" bits by the bit-shifting circuit 80.

In addition, the present invention is not restricted to the above-described embodiment, and various modifications may be made. For example, the CDS circuit may be arranged otherwise. Also, the photodiodes may be arranged two- or one-dimensionally, or only one photodiode may be arranged.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The photodetector according to the present invention is applicable to, for example, a solid-state imaging device including one or more photodiodes.

The invention claimed is:

1. A photodetector comprising:
a photodiode generating charges in response to the intensity of incident light;
an integrating circuit having an integral capacitor unit whose capacitance is variable, said integrating circuit making said integral capacitor unit accumulate charges generated by said photodiode therein, and outputting a first voltage value corresponding to the amount of charge accumulated in said integral capacitor unit;
a CDS circuit receiving the first voltage value outputted from said integrating circuit, and outputting a second voltage value corresponding to the variation of the first voltage value with reference to that at a reference time;
a selecting circuit receiving the first voltage value outputted from said integrating circuit together with the second voltage value outputted from said CDS circuit, selecting one of these values, and outputting the selected voltage value as an output voltage value; and
a switching circuit comparing the amount of charge generated by said photodiode with a threshold value therefor, said switching circuit instructing said integrating circuit to set said integral capacitor unit the capacitance of said integrating circuit and instructing said selecting circuit to select the output voltage value, based on the result of the comparison,
wherein, when the amount of charge generated by said photodiode is the threshold value or more, said switching circuit instructs said integrating circuit to set said integral capacitor unit to a first capacitance and instructs said selecting circuit to output the first voltage value as the selected output voltage value, and
wherein, when the amount of charge generated by said photodiode is smaller than the threshold value, said switching circuit instructs said integrating circuit to set said integral capacitor unit to a second capacitance smaller than the first capacitance and instructs said selecting circuit to output the second voltage value as the selected output voltage value.

2. A photodetector according to claim 1, further comprising an A/D converting circuit receiving the voltage value outputted from said selecting circuit, converting the voltage value into a digital value, and outputting the converted digital value.

3. A photodetector according to claim 2, further comprising a bit-shifting circuit receiving the digital value outputted from said A/D converting circuit, bit-shifting the digital value depending on the condition that said integral capacitor unit in said integrating circuit is set to one of the first capacitance and second capacitance, and outputting the bit-shifted digital value.

* * * * *